(12) United States Patent
Plach et al.

(10) Patent No.: US 8,975,158 B2
(45) Date of Patent: Mar. 10, 2015

(54) METHOD FOR PERMANENTLY BONDING WAFERS

(75) Inventors: Thomas Plach, Linz (AT); Kurt Hingerl, Wolfern (AT); Markus Wimplinger, Ried im Innkreis (AT); Christoph Flötgen, Pramerdorf (AT)

(73) Assignee: EV Group E. Thallner GmbH, St. Florian am Inn (AT)

( * ) Notice: Subject to any disclaimer, the term of this patent is extended or adjusted under 35 U.S.C. 154(b) by 0 days.

(21) Appl. No.: 14/110,220

(22) PCT Filed: Apr. 8, 2011

(86) PCT No.: PCT/EP2011/055471
§ 371 (c)(1),
(2), (4) Date: Nov. 7, 2013

(87) PCT Pub. No.: WO2012/136268
PCT Pub. Date: Oct. 11, 2012

(65) Prior Publication Data
US 2014/0073112 A1    Mar. 13, 2014

(51) Int. Cl.
| | | |
|---|---|---|
| H01L 21/46 | (2006.01) | |
| H01L 21/20 | (2006.01) | |
| H01L 21/3105 | (2006.01) | |
| H01L 21/762 | (2006.01) | |

(52) U.S. Cl.
CPC ............ *H01L 21/20* (2013.01); *H01L 21/2007* (2013.01); *H01L 21/3105* (2013.01); *H01L 21/76251* (2013.01)
USPC ............................ 438/455; 438/459; 438/458

(58) Field of Classification Search
USPC .......................................... 438/455, 458, 459
See application file for complete search history.

(56) References Cited

U.S. PATENT DOCUMENTS

| | | | | |
|---|---|---|---|---|
| 2006/0240642 A1* | 10/2006 | Kerdiles | ...................... | 438/455 |
| 2006/0260642 A1 | 11/2006 | Verhaverbeke et al. | ........ | 134/1.3 |
| 2009/0098709 A1 | 4/2009 | Ohnuma et al. | .............. | 438/458 |
| 2009/0294072 A1* | 12/2009 | Kerdiles et al. | ............ | 156/380.9 |
| 2010/0029058 A1 | 2/2010 | Shimomura et al. | .......... | 438/458 |
| 2013/0207244 A1* | 8/2013 | David et al. | .................... | 257/632 |

OTHER PUBLICATIONS

Suni T, et al., "Effects of Plasma Activation on Hydrophilic Bonding of Si and SI02," Journal of the Electrochemical Society, Electrochemical Society, Manchester, New Hampshire U.S.A., vol. 149, No. 6, Jun. 1, 2002; pp. G348-G351 (document XP008046162).

Weinert A. et al., "Plasma Assisted Room Temperature Bonding for MST," Sensors and Actuators A, Elsevier Sequoia S.A., Lausanne, Sweden, vol. 92, No. 1-3, Aug. 1, 2001, pp. 214-222 (document XP004274049).

Int'l Search Report from corresponding PCT/EP2011/055471 (Form PCT/ISA/210); 3 pages.

Office Action issued in connection with corresponding Singapore Patent Application No. 2013068333, dated Sep. 12, 2014.

\* cited by examiner

*Primary Examiner* — Bradley K Smith
(74) *Attorney, Agent, or Firm* — Kusner & Jaffe

(57) ABSTRACT

A method for bonding of a first contact surface of a first substrate to a second contact surface of a second substrate. The method comprises:

- forming at least one reservoir in at least one reservoir formation layer on the first substrate and/or the second substrate, the reservoir comprised of an amorphous material,
- at least partial filling of the reservoir/reservoirs with a first educt or a first group of educts,
- forming or applying a reaction layer which contains a second educt or a second group of educts to the reservoir and/or the reservoir,
- the first contact surface making contact with the second contact surface for formation of a prebond connection, and
- forming a permanent bond between the first and second contact surface, at least partially strengthened by the reaction of the first educt or the first group with the second educt or the second group.

12 Claims, 3 Drawing Sheets

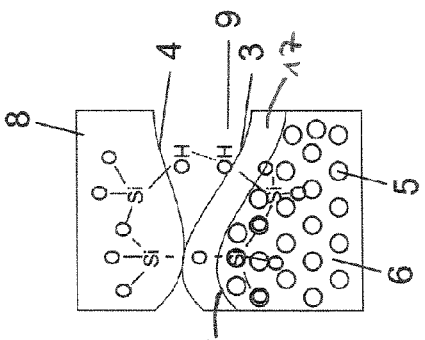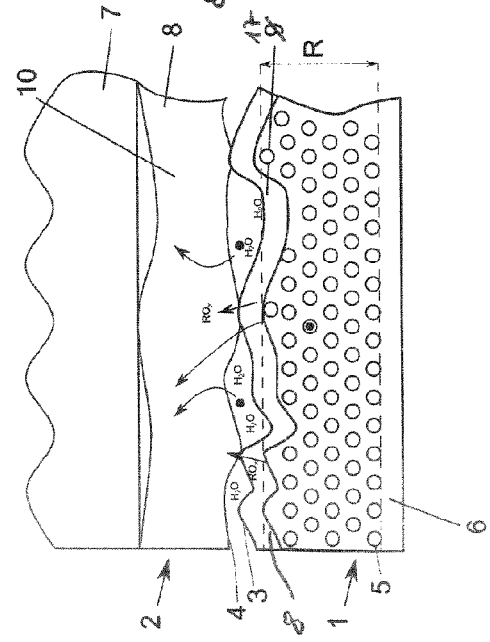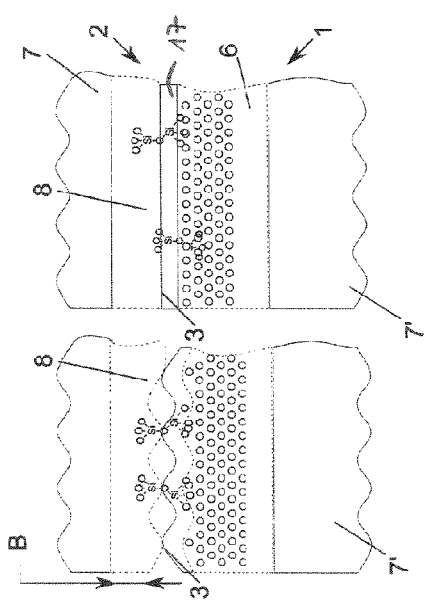

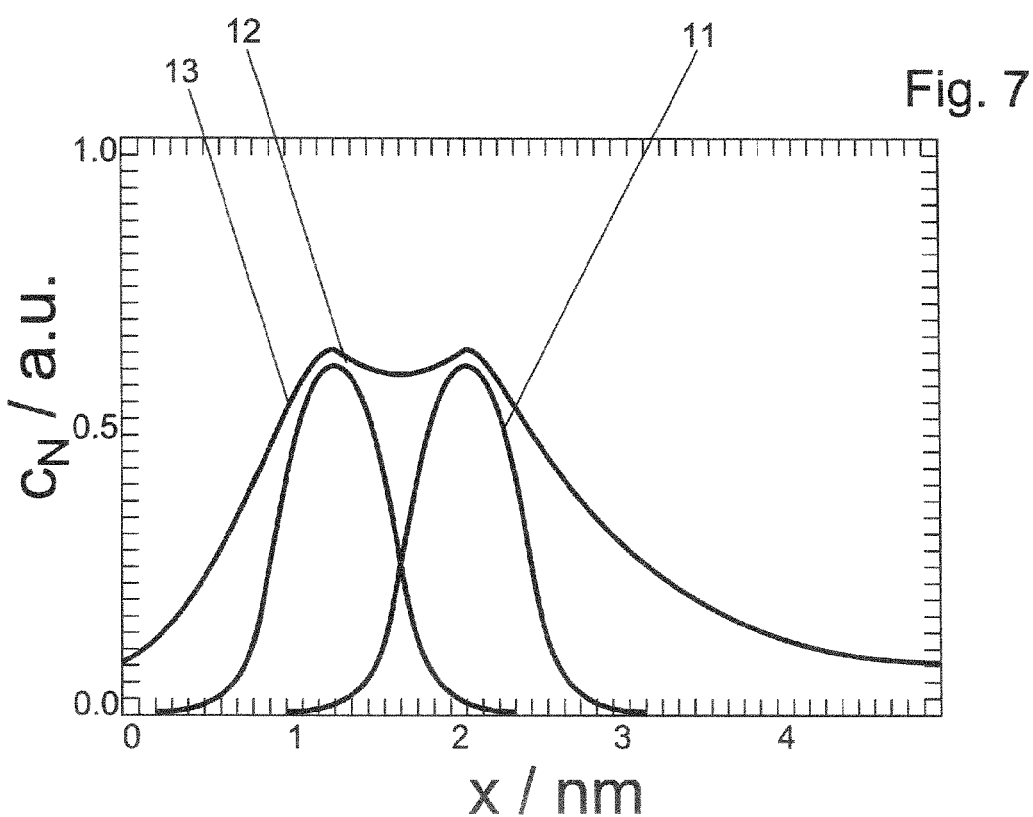

METHOD FOR PERMANENTLY BONDING WAFERS

FIELD OF THE INVENTION

This invention relates to a method for bonding of a first contact surface of a first substrate to a second contact surface of a second substrate.

BACKGROUND OF THE INVENTION

The objective in permanent or irreversible bonding of substrates is to produce an interconnection which is as strong and especially as irreversible as possible, i.e., a high bond force, between the two contact surfaces of the substrates. There are various approaches and production methods for this purpose in the prior art.

The known production methods and the approaches which have been followed to date often lead to results which cannot be reproduced or can be poorly reproduced and which can hardly be applied especially to altered conditions. In particular, production methods which are used at present often use high temperatures, especially >400° C., in order to ensure reproducible results.

Technical problems such as high energy consumption and a possible destruction of structures which are present on the substrates result from the high temperatures to some extent far above 300° C. which have been necessary to date for a high bond force.

Other demands consist in the following:
front-end-of-line compatibility.

This is defined as the compatibility of the process during the production of the electrically active components. The bonding process must therefore be designed such that active components such as transistors, which are already present on the structure wafers, are neither adversely affected nor damaged during the processing. Compatibility criteria include mainly the purity of certain chemical elements (mainly in CMOS structures) and mechanical loadability, mainly by thermal stresses.

low contamination.
no application of force.
temperature as low as possible, especially for materials with different coefficients of thermal expansion.

The reduction of the bond force leads to more careful treatment of the structure wafer and thus to a reduction of the failure probability by direct mechanical loading.

The object of this invention is therefore to devise a method for careful production of a permanent bond having a bond force which is as high as possible at a temperature which is at the same time as low as possible.

SUMMARY OF THE INVENTION

This object is achieved with the features of Claim 1. Advantageous developments of the invention are given in the dependent claims. All combinations of at least two of the features given in the specification, the claims and/or the figures also fall within the framework of the invention. At the given value ranges, values within the indicated limits will also be considered to be disclosed as boundary values and will be claimed in any combination.

The basic idea of this invention is to create a reservoir for holding a first educt at least on one of the substrates, to react the first educt after making contact or producing a temporary bond between the substrates with a second educt which is present in one of the two substrates, especially in a reaction layer, and thus to form an irreversible or permanent bond between the substrates. Before or after forming the reservoir in a reservoir formation layer in the first and/or second substrate, generally cleaning of the substrate or substrates, especially by a flushing step, occurs. This cleaning should generally ensure that there are no particles on the surfaces which would result in unbonded sites.

After formation of the reservoir or reservoirs, to shorten the distance between the educts, at least one reaction layer is applied to at least one of the reservoirs or is formed on them. The reaction layer is comprised especially of the second educt, preferably an oxidizable material, more preferably of silicon.

The reservoir, and the educt contained in the reservoir, create the technical possibility of inducing a reaction which increases the bonding speed and strengthens the permanent bond directly on the contact surfaces after producing the temporary or reversible bond in a dedicated manner, especially by deforming at least one of the contact surfaces by the reaction, preferably the contact surface or the two contact surfaces opposite the reservoir.

For the prebonding step, for producing a temporary or reversible bond between the substrates there are various possibilities with the objective of producing a weak interaction between the contact surfaces of the substrates. The prebond strengths are below the permanent bond strengths, at least by a factor of 2 to 3, especially by a factor of 5, preferably by a factor of 15, still more preferably by a factor of 25. As guideline values, the prebond strengths of pure, nonactivated, hydrophilized silicon with roughly 100 mJ/m$^2$ and of pure, plasma-activated hydrophilized silicon with roughly 200-300 mJ/m$^2$ are mentioned. The prebonds between the molecule-wetted substrates arise mainly due to the van-der-Waals interactions between the molecules of the different wafer sides. Accordingly, mainly molecules with permanent dipole moments are suitable for enabling prebonds between wafers. The following chemical compounds are mentioned as interconnect agents by way of example, but not limited thereto:

water
thiols
AP3000
silanes and/or
silanols.

Substrates as claimed in the invention are those whose material is able to react as an educt with another supplied educt to form a product with a higher molar volume, as a result of which the formation of a growth layer on the substrate is caused. The following combinations are especially advantageous, to the left of the arrow the educt being named and to the right of the arrow, the product/products (without the supplied educt or byproducts which react with the educt being named in particular):

Si→$SiO_2$, $Si_3N_4$, $SiN_xO_y$,
Ge→$GeO_2$, $Ge_3N_4$
α-Sn→$SnO_2$
B→$B_2O_3$, BN
Se→$SeO_2$
Te→$TeO_2$, $TeO_3$
Mg→MgO, $Mg_3N_2$
Al→$Al_2O_3$, AlN
Ti→$TiO_2$, TiN
V→$V_2O_5$
Mn→MnO, $MnO_2$, $Mn_2O_3$, $Mn_2O_7$, $Mn_3O_4$
Fe→FeO, $Fe_2O_3$, $Fe_3O_4$
Co→CoO, $Co_3O_4$,
Ni→NiO, $Ni_2O_3$
Cu→CuO, $Cu_2O$, $Cu_3N$

Zn→ZnO
Cr→CrN, $Cr_{23}C_6$, $Cr_3C$, $Cr_7C_3$, $Cr_3C_2$
Mo→$Mo_3C_2$
Ti→TiC
Nb→$Nb_4C_3$
Ta→$Ta_4C_3$
Zr→ZrC
Hf→HfC
V→$V_4C_3$, VC
W→$W_2C$, WC
Fe→$Fe_3C$, $Fe_7C_3$, $Fe_2C$

The following mixed forms of semiconductors are also conceivable as substrates:
III-V: GaP, GaAs, InP, InSb, InAs, GaSb, GaN, AlN, InN, $Al_xGa_{1-x}As$, $In_xGa_{1-x}N$
IV-IV: SiC, SiGe,
III-IV: InAlP,
nonlinear optics: $LiNbO_3$, $LiTaO_3$, KDP ($KH_2PO_4$)
solar cells: CdS, CdSe, CdTe, $CuInSe_2$, $CuInGaSe_2$, $CuInS_2$, $CuInGaS_2$
conductive oxides: $In_{2-x}Sn_xO_{3-y}$ According to the invention, on at least one of the wafers there is the reservoir (or reservoirs) in which a certain amount of at least one of the supplied educts for the volume expansion reaction can be stored. Educts can therefore be for example $O_2$, $O_3$, $H_2O$, $N_2$, $NH_3$, $H_2O_2$, etc. Due to the expansion, especially dictated by oxide growth, based on the tendency of the reaction partners to reduce system energy, possible gaps, pores, and cavities between the contact surfaces are minimized and the bond force is increased accordingly by narrowing the distances between the substrates in these regions. In the best possible case the existing gaps, pores and cavities are completely closed so that the entire bonding area increases and thus the bond force rises accordingly. The reaction between the first and the second educt for growth of the growth layer is accelerated by a reaction layer which has been made especially thinner than the reservoir, preferably at least half as thin, comprising at least largely of the second educt, being applied to or formed on the reservoir. The choice of the thickness of the applied reaction layer is made such that essentially the entire reaction layer is consumed during the reaction of the first with the second educt. According to the size of the reaction layer, the formation of the reservoir and filling of the reservoir are also controlled. The thickness of the additionally applied reaction layer is especially between 1 and 15 nm, preferably between 2 and 10 nm, still more preferably between 3 and 5 nm.

According to the invention, it is especially advantageous if after application of the additional reaction layer, contact-making takes place as contemporaneously as possible, especially within 2 hours, preferably within 30 minutes, still more preferably within 10 minutes, ideally within 5 minutes. This measure minimizes possible unwanted reactions such as oxidation of the reaction layer.

In accordance with the present invention, there can be means for inhibiting these reactions of the reaction layer before the contact surfaces make contact, especially by passivation of the reaction layer of the second substrate, preferably by exposure to $N_2$, forming gas or an inert atmosphere or under a vacuum or by amorphization. In this respect, treatment with plasma which contains forming gas, especially comprised largely of forming gas, has proven especially suitable. Here forming gas is defined as gases which contain at least 2%, better 4%, ideally 10 or 15% hydrogen. The remaining portion of the mixture consists of an inert gas such as for example nitrogen or argon. Systems with inert atmosphere or vacuum atmosphere can be preferably implemented as systems in which the transfer of the substrates from one process chamber to the next process chamber takes place by means of a substrate handling system which can carry out the transfer of the substrates entirely in a controlled, adjustable atmosphere, especially a vacuum atmosphere. These systems are conventional in the industry and are known to one skilled in the art.

The contact surfaces conventionally show a roughness with a quadratic roughness ($R_q$) of 0.2 nm. This corresponds to peak-to-peak values of the surfaces in the range of 1 nm. These empirical values were determined with Atomic Force Microscopy (AFM).

The reaction as claimed in the invention is suitable for allowing the growth layer to grow by 0.1 to 0.3 nm for a conventional wafer surface of a circular wafer with a diameter of 200 to 300 mm with 1 monolayer (ML) of water.

According to the invention it is therefore provided in particular that at least 2 ML, preferably at least 5 ML, even more preferably at least 10 ML of fluid, especially water, be stored in the reservoir.

The formation of the reservoir by exposure to plasma is especially preferable, since plasma exposure moreover causes smoothing of the contact surface and hydrophilization as synergy effects. The surface is smoothed by plasma activation predominantly by a viscous flow of the material of the reservoir formation layer. The increase of the hydrophilicity takes place especially by the increase of the silicon hydroxyl compounds, preferably by cracking of Si—O compounds present on the surface, such as Si—O—Si, especially according to the following reaction:

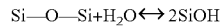

Si—O—Si+$H_2O$ ↔ 2SiOH

Another side effect, especially as a result of the aforementioned effects, comprises in that the prebond strength is improved especially by a factor of 2 to 3.

The reservoir in the reservoir formation layer on the first contact surface of the first substrate (and optionally of a reservoir formation layer on the second contact surface of the second substrate) is formed for example by plasma activation of the first substrate which has been coated with a thermal oxide. The plasma activation is carried out in a vacuum chamber in order to be able to adjust the conditions necessary for the plasma. According to the invention, $N_2$ gas, $O_2$ gas or argon gas with ion energies in the range from 0 to 2000 eV is used for the plasma discharge, as a result of which a reservoir is produced with a depth of up to 20 nm, preferably up to 15 nm, more preferably up to 10 nm, most preferably up to 5 nm, of the treated surface, in this case the first contact surface. In accordance with the invention, any particle type, atoms and/or molecules which are suitable for producing the reservoir can be used. Preferably those atoms and/or molecules are used which the reservoir produces with the required properties. The relevant properties are mainly the pore size, pore distribution and pore density. Alternatively, as claimed in the invention gas mixtures such as for example air or forming gas consisting of 95% Ar and 5% $H_2$ can be used. Depending on the gas used, in the reservoir during the plasma treatment, the following ions are present among others: N+, $N_2$+, O+, $O_2$+, Ar+. The first educt can be accommodated in the unoccupied free space of the reservoir/reservoirs. The reservoir formation layer and accordingly the reservoir can extend into the reaction layer.

Advantageously there are different types of plasma species which can react with the reaction layer and which comprise at least partially, preferably mostly of the first educt. To the extent the second educt is Si/Si, an $O_x$ plasma species would be advantageous.

The reservoir/reservoirs is/are formed based on the following considerations: The pore size is smaller than 10 nm, preferably smaller than 5 nm, more preferably smaller than 1 nm, even more preferably smaller than 0.5 nm, most preferably smaller than 0.2 nm.

The pore density is preferably directly proportional to the density of the particles which produce the pores by striking action, most preferably can even be varied by the partial pressure of the striking species, and depending on the treatment time and the parameters, especially of the plasma system used.

The pore distribution preferably has at least one region of greatest pore concentration under the surface, by variation of the parameters of several such regions which are superimposed into a preferably plateau-shaped region (see FIG. 7). The pore distribution converges toward zero with increasing depth. The region near the surface during bombardment has a pore density which is almost identical to the pore density near the surface. After the end of plasma treatment the pore density on the surface can be reduced as a result of stress relaxation mechanisms. The pore distribution in the thickness direction with respect to the surface has one steep flank and with respect to the bulk a rather flatter, but continuously decreasing flank (see FIG. 7).

For the pore size, the pore distribution and pore density, similar considerations apply to all methods not produced with plasma.

The reservoir can be designed by controlled use and combination of process parameters. FIG. 7 shows a representation of the concentration of injected nitrogen atoms by plasma as a function of the penetration depth into a silicon oxide layer. It was possible to produce two profiles by variation of the physical parameters. The first profile 11 was produced by more highly accelerated atoms more deeply in the silicon oxide, conversely the profile 12 was produced after altering the process parameters in a lower density. The superposition of the two profiles yields a sum curve 13 which is characteristic for the reservoir. The relationship between the concentration of the injected atom and/or molecule species is evident. Higher concentrations designate regions with higher defect structure, therefore more space to accommodate the subsequent educt. A continuous change of the process parameters which is controlled especially in a dedicated manner during the plasma activation makes it possible to achieve a reservoir with a distribution of the added ions over the depth, which (distribution) is as uniform as possible.

As a reservoir, alternatively to a reservoir produced by plasma, the use of a TEOS (tetraethyl orthosilicate)-oxide layer on at least one of the substrates, at least the first substrate, is conceivable. This oxide is generally less dense than thermal oxide, for which reason compaction is advantageous as claimed in the invention. The compaction takes place by heat treatment with the objective of setting a defined porosity of the reservoir.

According to one embodiment of the invention, the filling of the reservoir can take place especially advantageously at the same time with the formation of the reservoir by the reservoir being applied as a coating to the first substrate, the coating already encompassing the first educt.

The reservoir is conceivable as a porous layer with a porosity in the nanometer range or as a layer which has channels with a channel density smaller than 10 nm, more preferably smaller than 5 nm, even more preferably smaller than 2 nm, most preferably smaller than 1 nm, most preferably of all smaller than 0.5 nm.

For the step of filling of the reservoir with a first educt or a first group of educts, as claimed in the invention the following embodiments, also in combination, are conceivable:
 exposing the reservoir to the ambient atmosphere,
 flushing with especially deionized water,
 flushing with a fluid which contains the educt or which consists of it, especially $H_2O$, $H_2O_2$, $NH_4OH$
 exposing the reservoir to any gas atmosphere, especially atomic gas, molecular gas, gas mixtures,
 exposing the reservoir to a water vapor- or hydrogen peroxide vapor-containing atmosphere and
 depositing a reservoir already filled with the educt as a reservoir formation layer on the first substrate.

The following compounds are possible as educts: $O_x^+$, $O_2$, $O_3$, $N_2$, $NH_3$, $H_2O$, $H_2O_2$, and/or $NH_4OH$.

The use of the above cited hydrogen peroxide vapor is regarded as the preferred version in addition to using water. Hydrogen peroxide furthermore has the advantage of having a greater oxygen to hydrogen ratio. Furthermore, hydrogen peroxide dissociates above certain temperatures and/or via the use of high frequency fields in the MHz range into hydrogen and oxygen.

Mainly when using materials with different coefficients of thermal expansion the use of methods for dissociation of the aforementioned species which do not cause any noteworthy temperature increase or at best a local/specific temperature increase is advantageous. In particular there is microwave irradiation which at least promotes, preferably causes the dissociation.

The (additionally applied) reaction layer is applied by one or more of the following methods:
 PECVD
 LPCVD
 vapor deposition
 epitaxy
 MOCVD According to one advantageous embodiment of the invention, the formation of the growth layer and strengthening of the irreversible bond takes place by diffusion of the first educt into the reaction layer.

According to another advantageous embodiment of the invention, t the formation of the irreversible bond takes place at a temperature of typically less than 300° C., advantageously less than 200° C., more preferably less than 150° C., even more preferably less than 100° C., most preferably at room temperature, especially during a maximum 12 days, more preferably a maximum 1 day, even more preferably a maximum 1 hour, most preferably a maximum 15 minutes. Another advantageous heat treatment method is dielectric heating by microwaves.

Here it is especially advantageous if the irreversible bond has a bond strength of greater than 1.5 $J/m^2$, especially greater than 2 $J/m^2$, preferably greater than 2.5 $J/m^2$.

The bond strength can be increased especially advantageously in that during the reaction, as claimed in the invention a product with a greater molar volume than the molar volume of the second educt is formed in the reaction layer. In this way growth on the second substrate is effected, as a result of which gaps between the contact surfaces can be closed by the chemical reaction as claimed in the invention. As a result, the distance between the contact surfaces, therefore the average distance, is reduced, and dead spaces are minimized.

To the extent the formation of the reservoir takes place by plasma activation, especially with an activation frequency between 10 and 600 kHz and/or a power density between 0.075 and 0.2 watt/$cm^2$ and/or with pressurization with a pressure between 0.1 and 0.6 mbar, additional effects such as smoothing of the contact surface and also a clearly increased hydrophilicity of the contact surface are effected.

Alternatively thereto, the formation of the reservoir can take place as claimed in the invention by use of a tetraethoxysilane oxide layer compacted in a controlled manner to a certain porosity as reservoir formation layer.

According to another advantageous embodiment of the invention it is provided that the reservoir formation layer is comprised largely, especially essentially completely, of an especially amorphous, silicon dioxide, especially one produced by thermal oxidation, and the reaction layer consists of an oxidizable material, especially predominantly, preferably essentially completely, of Si, Ge, InP, GaP or GaN (or another material mentioned alternatively above). An especially stable reaction which especially effectively closes the existing gaps is enabled by oxidation.

In addition to the reaction layer applied after formation of the reservoir/reservoirs, under each reservoir as claimed in the invention there can be another reaction layer, especially largely consisting of the second educt or the second group. In other words, as claimed in the invention the first substrate (1) has one reaction layer and/or the second substrate has one reaction layer, at least largely comprised of the second educt or the second group, adjacent to the reservoir formation layers.

Here it is especially advantageous as claimed in the invention if the reservoir formation layer and/or the reaction layer act as growth layer. The growth layer is subject to growth caused by the reaction as claimed in the invention. The growth takes place proceeding from the transition Si—$SiO_2$ by reformation of amorphous $SiO_2$ and the deformation caused thereby, especially bulging, of the growth layer, especially on the interface to the reaction layer, and especially in regions of gaps between the first and the second contact surface. This causes a reduction of the distance or a reduction of the dead space between the two contact surfaces, as a result of which the bond strength between the two substrates is increased. A temperature between 200 and 400° C., preferably roughly 200° C. and 150° C., more preferably a temperature between 150° C. and 100° C., most preferably a temperature between 100° C. and room temperature, is especially advantageous. The growth layer can be divided into several growth regions. The growth layer can at the same time be a reservoir formation layer of the second substrate in which another reservoir which accelerates the reaction is formed.

Here it is especially advantageous if the growth layer has an average thickness "A" between 0.1 nm and 5 nm prior to formation of the irreversible bond. The thinner the growth layer, the more quickly and easily the reaction takes place between the first and the second educt through the growth layer, especially by diffusion of the first educt through the growth layer to the reaction layer. The diffusion rate of the educts through the growth layer is increased by the growth layer which has been especially thinned and thus is very thin at least at the beginning of the formation of the permanent bond or at the start of the reaction. This leads to a lower transport time of the educts at the same temperature.

According to one embodiment of the invention it is advantageously provided that the formation of the reservoir is carried out in a vacuum. Thus contamination of the reservoir with unwanted materials or compounds can be avoided.

In another embodiment of the invention, it is advantageously provided that filling of the reservoir takes place by one or more of the steps cited below:
- exposing the first contact surface to the atmosphere, for filling the reservoir with atmospheric humidity and/or oxygen contained in the air,
- exposing the first contact surface to a fluid comprised especially predominantly, preferably almost completely, of especially deionized $H_2O$ and/or $H_2O_2$,
- exposing the first contact surface to $N_2$ gas and/or $O_2$ gas and/or Ar gas and/or forming gas, especially consisting of 95% Ar and 5% $H_2$, especially with an ion energy in the range from 0 to 2000 eV,
- vapor deposition for filling the reservoir with any already named educt.

It is especially effective for the process sequence if the reservoir is formed preferably in a thickness R between 0.1 nm and 25 nm, more preferably between 0.1 nm and 15 nm, even more preferably between 0.1 nm and 10 nm, most preferably between 0.1 nm and 5 nm. Furthermore, according to one embodiment of the invention it is advantageous if the average distance B between the reservoir and the reaction layer of the opposing substrate immediately before formation of the irreversible bond is between 0.1 nm and 15 nm, especially between 0.5 nm and 5 nm, preferably between 0.5 nm and 3 nm. The distance B can be influenced by thinning.

A device for executing the method is formed as claimed in the invention with a chamber for forming the reservoir, a chamber provided especially separately for filling the reservoir, and an especially separately provided chamber for forming the prebond, all of which chambers are connected directly to one another via a vacuum system.

In another embodiment the filling of the reservoir can also take place directly via the atmosphere, therefore either in a chamber which can be opened to the atmosphere or simply on a structure which does not have jacketing but can handle the wafer semiautomatically and/or completely automatically.

Other advantages, features and details of the invention will become apparent from the following description of preferred exemplary embodiments and using the drawings.

BRIEF DESCRIPTION OF THE DRAWINGS

FIG. 3 shows another step of the method as claimed in the invention which follows the steps according to FIG. 1, FIG. 2a and FIG. 2b, with substrate contact surfaces which are in contact, FIG. 4 shows a step as claimed in the invention for formation of an irreversible/permanent bond between the substrates, FIG. 5 shows an enlargement of the chemical/physical processes which proceed on the two contact surfaces during the steps according to FIG. 3 and FIG. 4, FIG. 6 shows a further enlargement of the chemical/physical processes which proceed on the interface between the two contact surfaces during the steps according to FIG. 3 and FIG. 4 and FIG. 7 shows a diagram of the production of the reservoir as claimed in the invention.

DETAILED DESCRIPTION OF PREFERRED EMBODIMENTS

Figures 1A, 1B, 2A, 2B:
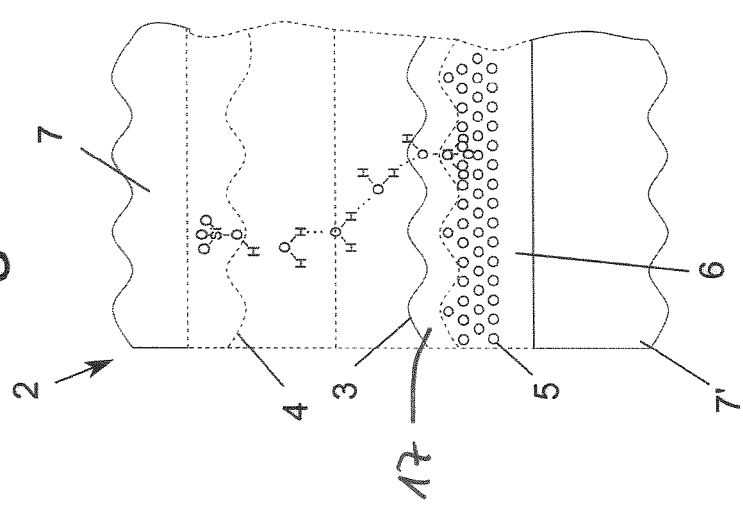
FIG. 1a shows a first step of the method as claimed in the invention immediately after the first substrate makes contact with the second substrate.
FIG. 1b shows an alternative first step of the method as claimed in the invention immediately after the first substrate makes contact with the second substrate.
FIGS. 2a and 2b show other steps of the method as claimed in the invention for forming a higher bond strength.

The same or equivalent features are identified with the same reference numbers in the figures.

In the situation shown in FIG. 1a only one extract of the chemical reactions which proceed during or immediately after the prebond step between a first contact surface 3 of a first substrate 1 and a second contact surface 4 of a second substrate 2 is shown [sic]. The surfaces are terminated with polar OH groups and are accordingly hydrophilic. The first substrate 1 and the second substrate 2 are held by the force of attraction of the hydrogen bridges between the OH groups present on the surface and the $H_2O$ molecules and also between the $H_2O$ molecules alone. The hydrophilicity of at least the first substrate 1 has been increased by plasma treatment in a preceding step.

It is especially advantageous to additionally subject the second substrate 2 or the second contact surface 4 to plasma treatment, especially at the same time with the plasma treatment of the first substrate 1 according to the alternative embodiment.

A reservoir 5 in the reservoir formation layer 6 comprised of thermal silicon dioxide as well as in the alternative embodiment according to FIG. 1b a second opposing reservoir 5' in the reservoir formation layer 6' have been formed as claimed in the invention by plasma treatment. Under the reservoir formation layers 6, 6' reaction layers 7, 7' which contain a second educt or a second group of educts directly adjoin. Plasma treatment with $O_2$ ions with ion energies in the range between 0 and 2000 eV yields an average thickness R of the reservoir 5 of roughly 15 nm, the ions forming channels or pores in the reservoir formation layer 6.

Likewise the reservoir 5 (and optionally the reservoir 5') is filled at least largely with $H_2O$ as the first educt prior to the step shown in FIG. 1 and after plasma treatment. Reduced species of the ions present in the plasma process can also be located in the reservoir, especially $O_2$, $N_2$, $H_2$, Ar.

A very thin reaction layer 17 which contains the second educt is applied to the reservoir 5. The reaction layer 17 is applied by one or more of the following methods:

PECVD
LPCVD
vapor deposition and
epitaxy
MOCVD

Thus, in this invention it is advantageously possible to form the reservoirs as a thicker, especially amorphous oxide layer since optionally in addition to under the reservoir formation layers 6, 6' there are reaction layers 7, 7' which likewise contain the second educt, specifically silicon in the example described here.

The contact surfaces 3, 4 still have a relatively wide gap, especially dictated by the water present between the contact surfaces 3, 4, after making contact in the stage shown in FIGS. 1a and 1b. Accordingly the existing bond strength is relatively low and is roughly between 100 mJ/$cm^2$ and 300 mJ/$cm^2$, especially more than 200 mJ/$cm^2$. In this connection the prior plasma activation plays a decisive part, especially due to the increased hydrophilicity of the plasma-activated first contact surface 3 and a smoothing effect which is caused by the plasma activation.

The process which is shown in FIG. 1 and which is called prebond can preferably proceed at ambient temperature or a maximum 50° C. FIGS. 2a and 2b show a hydrophilic bond, the Si—O—Si bridge arising with splitting of water by —OH terminated surfaces. The processes in FIGS. 2a and 2b last roughly 300 h at room temperature. At 50° C. roughly 60 h. The state in FIG. 2b occurs at the indicated temperatures without producing the reservoir 5 (or reservoirs 5, 5').

Between the contact surfaces 3, 4, $H_2O$ molecules are formed and provide at least partially for further filling in the reservoir 5 to the extent there is still free space. The other $H_2O$ molecules are removed. In the step according to FIG. 1 roughly 3 to 5 individual layers of OH groups or $H_2O$ are present and 1 to 3 monolayers of $H_2O$ are removed or accommodated in the reservoir 5 from the step according to FIG. 1 to the step according to FIG. 2a.

In the step shown in FIG. 2a, the hydrogen bridge bonds are now formed directly between siloxane groups, as a result of which a greater bond force arises. This draws the contact surfaces 3, 4 more strongly to one another and reduces the distance between the contact surfaces 3, 4. Accordingly there are only 1 to 2 individual layers of OH groups between the contact surfaces 1, 2.

In the step shown in FIG. 2b, in turn with separation of $H_2O$ molecules according to the reaction which has been inserted below, covalent compounds in the form of silanol groups are now formed between the contact surfaces 3, 4 which lead to a much stronger bond force and require less space so that the distance between the contact surfaces 3, 4 is further reduced until finally the minimum distance shown in FIG. 3 is reached based on the contact surfaces 3, 4 directly meeting one another:

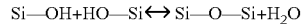

Up to stage 3, especially due to the formation of the reservoir 5 (and optionally of the additional reservoir 5'), it is not necessary to unduly increase the temperature, rather to allow it to proceed even at room temperature. In this way an especially careful progression of the process steps according to FIG. 1 to FIG. 3 is possible.

In the process step shown in FIG. 4, the temperature is preferably increased to a maximum 500° C., more preferably to a maximum 300° C., even more preferably to a maximum 200° C., most preferably to a maximum 100° C., most preferably of all not above room temperature in order to form an irreversible or permanent bond between the first and the second contact surface. Without the additional reaction layer 17 only a bond strength would be possible which depends in turn on the surface roughness. The temperatures which are relatively low, in contrast to the prior art, are only possible because the reservoir 5 (and optionally in addition the reservoir 5') encompasses the first educt for the reaction shown in FIGS. 5 and 6 and in addition there is reaction layer 17 which reduces the distance between the reservoir 5, 5' and/or the contact surfaces 4, 5 and the reaction layer 17 or which creates reaction surface in addition to the existing reaction layers 7, 7':

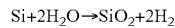

By increasing the molar volume and diffusion of the $H_2O$ molecules, especially on the interface between the reservoir formation layer 6' and the reaction layer 7, 17 (and optionally in addition on the interface between the reservoir formation layer 6 and the reaction layers 7', 17), volume in the form of a growth layer 8 increases, due to the objective of minimizing the free Gibbs enthalpy enhanced growth taking place in regions where gaps 9 are present between the contact surfaces 3, 4. The gaps 9 are closed by the increase in the volume of the growth layer 8. More exactly:

At the aforementioned slightly increased temperatures, $H_2O$ molecules diffuse as the first educt from the reservoir 5 (or the reservoirs 5, 5') to the reaction layer 7, 7', 17 (which is nearest, provided as claimed in the invention). This diffusion can take place either via a direct contact of the reservoir formation layer 6, 6' which is formed as oxide layers with the respective reaction layer 7, 7', 17 or via a gap 9 or from a gap 9 which is present between the oxide layers. There, silicon oxide, therefore a chemical compound with a greater molar volume than pure silicon, is formed as a reaction product 10 of the aforementioned reaction from the reaction layer 7. The silicon dioxide grows on the interface of the reaction layer 7 with the growth layer 8 and/or the reservoir formation layer 6, 6' and thus forms the growth layer 8 in the direction of the gaps 9. Here $H_2O$ molecules from the reservoir are also required.

Due to the existence of the gaps which are in the nanometer range, there is the possibility of bulging of the growth layer 8, as a result of which stresses on the contact surfaces 3, 4 can be reduced. In this way the distance between the contact surfaces 3, 4 is reduced, as a result of which the active contact surface and thus the bond strength are further increased. The weld connection which has arisen in this way, which closes all pores, and which forms over the entire wafer, in contrast to the products in the prior art which are partially not welded, fundamentally contributes to increasing the bond force. It is provided as claimed in the invention that the reaction layer 17 is essentially completely consumed by the reaction so that the reservoir formation layers 6, 6' are in direct contact at the end. The type of bond between the two amorphous silicon oxide surfaces which are welded to one another is a mixed form with covalent and ionic portion.

The aforementioned reaction of the first educt ($H_2O$) with the second educt (Si) takes place in the reaction layer 7 especially quickly or at temperatures as low as possible to the extent an average distance B between the first contact surface 3 and the reaction layer 7 is as small as possible.

Therefore the pretreatment of the first substrate 1 and the pretreatment of the second substrate 2 which each is comprised of a reaction layer 7, 7' of silicon and an amorphous oxide layer as reservoir 5, 5' are decisive. A reaction layer 17 as thin as possible is provided in addition as claimed in the invention for two reasons. The reaction layer 17 is very thin so that it can bulge through the newly formed reaction product 10 on one of the reaction layers 7, 7', 17 toward the reservoir formation layer 6, 6' of the respectively opposite substrate 1, 2 predominantly in regions of the nanogaps 9. Furthermore, diffusion paths as short as possible are desired in order to achieve the desired effect as quickly as possible and at a temperature as low as possible. The first substrate 1 likewise consists of a silicon layer and an oxide layer produced thereon as reservoir formation layer 6 in which the reservoir 5 is formed at least partially or completely.

The reservoir 5 (or the reservoirs 5, 5') is filled as claimed in the invention at least with the amount of the first educt which is necessary to close the nanogaps 9 so that an optimum growth of the growth layer 8 can take place to close the nanogaps 9 in a time as short as possible and/or at a temperature as low as possible.

REFERENCE NUMBER LIST

1 first substrate
2 second substrate
3 first contact surface
4 second contact surface
5, 5' reservoir
6, 6' reservoir formation layer
7, 7' reaction layer
8 growth layer
9 nanogaps
10 reaction product
11 first profile
12 second profile
13 sum curve
17 reaction layer
A average thickness
B average distance
R average thickness

The invention claimed is:

1. A method for bonding of a first contact surface of a first substrate to a second contact surface of a second substrate comprised of the following steps:
    forming at least one reservoir in at least one reservoir formation layer on the first substrate and/or the second substrate, the reservoir comprised at least largely of an amorphous material, wherein the forming of the at least one reservoir as reservoir formation layer is by use of a tetraethoxysilane-oxide layer,
    at least partial filling of the reservoir/reservoirs with a first educt or a first group after the at least one reservoir is formed,
    forming or applying a reaction layer which contains a second educt or a second group to the reservoirs,
    after the at least one reservoir is filled, bringing the first contact surface in contact with the second contact surface for formation of a prebond connection, and
    forming a permanent bond between the first and second contact surface, at least partially strengthened by the reaction of the first educt or the first group with the second educt or the second group.

2. The method as claimed in claim 1, wherein formation and/or strengthening of the permanent bond takes place by diffusion of the first educt into the reaction layer.

3. The method as claimed in claim 1, wherein the formation of the permanent bond takes place at a temperature between room temperature and 200° C. within 12 days.

4. The method as claimed in claim 1, wherein the irreversible bond has a bond strength of greater than 1.5 $J/m^2$.

5. The method as claimed in claim 1, wherein during the reaction a reaction product having a greater molar volume than the molar volume of the second educt is formed in the reaction layer.

6. The method as claimed in claim 1, wherein the reservoir formation layer is comprised of a second amorphous material produced by thermal oxidation, and the reaction layer is comprised of an oxidizable material.

7. The method as claimed in claim 1, wherein the first substrate has one reaction layer and/or the second substrate has one reaction layer comprised of the second educt, adjacent to the reservoir formation layers.

8. The method as claimed in claim 7, wherein before the formation of a permanent bond, the reservoir formation layer has an average thickness "A" between 1 angstrom and 10 nm.

9. The method as claimed in claim 1, wherein the reservoir formation layer and/or the reaction layer act as growth layer.

10. The method as claimed in claim 1, wherein the reservoir is filled by one or more of the steps cited below:
    exposing the first and/or second contact surface to an atmosphere with a high oxygen and/or water content,
    exposing the first and/or the second contact surface to a fluid comprised of especially deionized $H_2O$ and/or $H_2O_2$, and
    exposing the first and/or second contact surface to $N_2$ gas and/or $O_2$ gas and/or Ar gas and/or forming gas, comprised of 95% Ar and 5% $H_2$, with an ion energy in the range from 0 to 200 eV.

11. The method as claimed in claim 1, wherein the average distance between the reservoir and the reaction layer immediately before formation of the permanent bond is between 0.1 nm and 15 nm.

12. The method as claimed in claim 1, wherein the irreversible bond has a bond strength which comprises at least twice the prebond strength.

\* \* \* \* \*